United States Patent
Orimo et al.

(10) Patent No.: US 12,315,660 B2
(45) Date of Patent: May 27, 2025

(54) MAGNETIC BODY, COIL COMPONENT INCLUDING MAGNETIC BODY, AND METHOD OF MANUFACTURING MAGNETIC BODY

(71) Applicant: TAIYO YUDEN CO., LTD., Tokyo (JP)

(72) Inventors: Yoko Orimo, Tokyo (JP); Tomoo Kashiwa, Tokyo (JP); Takayuki Arai, Tokyo (JP); Hirotaro Seino, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 662 days.

(21) Appl. No.: 17/399,698

(22) Filed: Aug. 11, 2021

(65) Prior Publication Data
US 2022/0068525 A1    Mar. 3, 2022

(30) Foreign Application Priority Data
Aug. 31, 2020   (JP) ................. 2020-145709

(51) Int. Cl.
*H01F 27/28*      (2006.01)
*H01F 1/147*      (2006.01)
(Continued)

(52) U.S. Cl.
CPC ........... *H01F 1/147* (2013.01); *H01F 27/255* (2013.01); *H01F 27/28* (2013.01);
(Continued)

(58) Field of Classification Search
CPC ........ H01F 1/147; H01F 27/255; H01F 27/28; H01F 41/0246; H01F 1/24; H01F 17/04;
(Continued)

(56) References Cited

U.S. PATENT DOCUMENTS

2011/0267167 A1    11/2011   Ogawa et al.
2012/0119871 A1    5/2012    Ogawa et al.
(Continued)

FOREIGN PATENT DOCUMENTS

| | | |
|---|---|---|
| CN | 107275033 A | 10/2017 |
| JP | 2011-249774 A | 12/2011 |

(Continued)

OTHER PUBLICATIONS

Notice of Reasons for Refusal dated May 28, 2024, issued in corresponding Japanese Patent Application No. 2020-145709, with English translation (16 pgs.).
(Continued)

*Primary Examiner* — Tuyen T Nguyen
(74) *Attorney, Agent, or Firm* — Pillsbury Winthrop Shaw Pittman, LLP

(57) ABSTRACT

One object is to provide a magnetic body having a high mechanical strength. A magnetic body according to one embodiments of the present invention includes: first particles of a first alloy containing Fe and Cr; second particles of a second alloy containing at least one of Al or Mn; and bonding portions containing at least one of Al oxide or Mn oxide, the bonding portions bonding the first particles to each other. The bonding portions containing at least one of Al oxide or Mn oxide increase the mechanical strength of the magnetic body.

13 Claims, 7 Drawing Sheets

(51) Int. Cl.
*H01F 27/255* (2006.01)
*H01F 41/02* (2006.01)
*H05K 1/18* (2006.01)

(52) U.S. Cl.
CPC ......... *H01F 41/0246* (2013.01); *H05K 1/181* (2013.01); *H05K 2201/1003* (2013.01)

(58) Field of Classification Search
CPC ... H01F 1/14; H01F 1/20; H01F 5/003; H01F 41/02; H05K 1/181; H05K 2201/1003
See application file for complete search history.

(56) References Cited

U.S. PATENT DOCUMENTS

| | | | |
|---|---|---|---|
| 2013/0200970 A1 | 8/2013 | Ogawa et al. | |
| 2017/0287605 A1* | 10/2017 | Tanada | H01F 1/28 |
| 2018/0005739 A1* | 1/2018 | Orimo | C01G 37/02 |
| 2018/0374619 A1* | 12/2018 | Orimo | H01F 1/33 |

FOREIGN PATENT DOCUMENTS

| | | | | |
|---|---|---|---|---|
| JP | 2014-143286 A | 8/2014 | | |
| JP | 2015-126047 A | 7/2015 | | |
| JP | 7281319 B2 * | 5/2023 | ......... | H01F 1/14791 |
| WO | 2015108059 A1 | 3/2017 | | |
| WO | 2016010098 A1 | 4/2017 | | |

OTHER PUBLICATIONS

Notice of Reasons for Refusal dated Jan. 23, 2024, issued in corresponding Japanese Patent Application No. 2020-145709, with English machine translation (20 pages total).
Decision of Refusal dated Oct. 15, 2024, issued in corresponding Japanese Patent Application No. 2020-145709, with English translation (4 pgs.).
Decision of Dismissal of Amendment dated Oct. 15, 2024, issued in corresponding Japanese Patent Application No. 2020-145709, with English translation (11 pgs.).
Reconsideration Report by Examiner before Appeal dated Mar. 14, 2025, issued in corresponding Japanese Patent App. No. 2020-145709 with English machine translation (12 pgs.).

* cited by examiner

MAGNETIC BODY, COIL COMPONENT INCLUDING MAGNETIC BODY, AND METHOD OF MANUFACTURING MAGNETIC BODY

CROSS-REFERENCE TO RELATED APPLICATIONS

This application is based on and claims the benefit of priority from Japanese Patent Application Serial No. 2020-145709 (filed on Aug. 31, 2020), the contents of which are hereby incorporated by reference in their entirety.

TECHNICAL FIELD

The present invention relates to a magnetic body, a coil component including the magnetic body, and a method of manufacturing the magnetic body.

BACKGROUND

A coil component has basic characteristics such as inductance characteristics determined by combination of a magnetic body and a conductor. In particular, a magnetic material forming the magnetic body has a large impact on the characteristics of the coil component, and therefore, a magnetic material is typically selected in accordance with the structure and the service environment of the coil component. For example, a coil component for use in an automobile is required to operate under a high voltage, and thus ferrite-based magnetic materials have been often used since they have an excellent dielectric strength.

However, there has recently been a trend of the ferrite materials being replaced with metal magnetic materials in coil components for automobiles. This is because the metal magnetic materials are less prone to magnetic saturation than the ferrite materials and thus allow downsizing of the coil components. With the recent advancement of electronics in automobiles, an increasing number of electronic components are used. On the other hand, limited space is left for installation of electronic components and substrates thereof, and thus there is a demand for downsizing these electronic components. In order to meet this demand, coil components including metal magnetic materials have begun to be used.

Although metal magnetic materials have an advantage over ferrite materials in that they are less prone to magnetic saturation, they are inferior in electrical insulation. For this reason, a magnetic body made of metal magnetic materials could be electrically conductive under a high voltage. The magnetic body made of metal magnetic materials is composed of metal magnetic particles in contact with each other. Therefore, various means of improving the electrical insulation of the magnetic body have been studied, focusing on electrically insulating the surface of the metal magnetic particles.

In addition, coil components for automobiles are exposed to vibration and varying temperatures, and therefore, the magnetic body constituting these coil components are required to have a high mechanical strength and durability. Since the mechanical strength and durability of the magnetic body made of a metal magnetic material are provided mainly by bonding between the metal magnetic particles, it is also known to bond the metal magnetic particles simultaneously with electrically insulating the surfaces of the metal magnetic particles.

For example, Japanese Patent Application Publication No. 2011-249774 discloses that a molded body made of soft magnetic alloy particles containing iron, silicon, and an element more apt to oxidation than iron is heat-treated in the atmosphere to produce an oxide layer made of a metal oxide in the surfaces of the particles, such that the particles are bonded with each other via the oxide layer.

Also, Japanese Patent Application Publication No. 2015-126047 discloses that a Si compound such as TEOS or colloidal silica is applied or adhered to the surfaces of the particles of Fe—Si—Cr soft magnetic alloy powder, and after molding, the particles are heat-treated in the atmosphere to bond to each other via oxide layers.

As described above, coil components need to include a magnetic body having a high mechanical strength.

SUMMARY

One object of the present invention is to provide a novel magnetic body having a high mechanical strength and a coil component including the magnetic body.

A magnetic body according to one or more embodiments of the present invention comprises: first particles of a first alloy containing Fe and Cr; second particles of a second alloy containing at least one of Al or Mn; and bonding portions containing at least one of Al oxide or Mn oxide, the bonding portions bonding the first particles to each other.

In the magnetic body according to one or more embodiments of the present invention, a proportion by mass of a total of Al and Mn to a total of metal elements and Si element in the second particles is larger than a proportion by mass of Cr to a total of metal elements and Si element in the first particles.

In the magnetic body according to one or more embodiments of the present invention, a proportion by mass of Cr to a total of metal elements and Si element in the first particles is larger than a proportion by mass of a total of Al and Mn to a total of metal elements and Si element in the second particles.

In the magnetic body according to one or more embodiments of the present invention, the first particles include a first oxide film containing Si, and a proportion by mass of Si to a total of metal elements and Si element in the first oxide film is larger than that in the bonding portions. In the magnetic body according to one or more embodiments of the present invention, the first oxide film is an amorphous oxide film containing Si and Cr.

In the magnetic body according to one or more embodiments of the present invention, the second particles include a second oxide film containing Si, and a proportion by mass of Si to a total of metal elements and Si element in the second oxide film is larger than that in the bonding portions. In the magnetic body according to one or more embodiments of the present invention, the second oxide film is a crystalline oxide layer containing at least one of Al oxide or Mn oxide.

In the magnetic body according to one or more embodiments of the present invention, a number of the first particles is larger than that of the second particles.

In the magnetic body according to one or more embodiments of the present invention, a number of the second particles is larger than that of the first particles.

The magnetic body according to one or more embodiments of the present invention further comprises filling portions containing Si oxide and provided in voids among the first particles, the second particles, and the bonding portions.

In the magnetic body according to one or more embodiments of the present invention, the second particles have, in a surface thereof, an oxide layer containing at least one of Al oxide or Mn oxide.

A manufacturing method of a magnetic body according to one or more embodiments of the present invention comprises steps of: preparing first powder and second powder, the first powder being made of a first alloy containing Fe and Cr, the second powder being made of a second alloy containing at least one of Al or Mn; mixing together the first powder and the second powder to produce a powder mixture; and molding the powder mixture into a molded body; and heating the molded body to form bonding portions containing at least one of Al oxide or Mn oxide, the bonding portions bonding the first particles to each other.

In the manufacturing method of a magnetic body according to one or more embodiments of the present invention, the molded body contains a silicon resin added to the particle mixture. In the manufacturing method of a magnetic body according to one or more embodiments of the present invention, the step of heating the molded body forms the bonding portions and filling portions containing Si.

A coil component according to one or more embodiments of the present invention comprises any of the magnetic bodies described above or a magnetic body manufactured by any of the manufacturing methods described above, and a coil conductor provided in the magnetic body. A circuit board according to one or more embodiments of the present invention comprises the above coil component.

Advantageous Effects

According to the aspects of the invention, it is possible to provide a magnetic body having a high mechanical strength and a coil component including the magnetic body.

DESCRIPTION OF THE EMBODIMENTS

Embodiments of the present invention will be hereinafter described with reference to the drawings. Numerical ranges (pairs of numerical values connected by "to") include the upper limit and the lower limit thereof.

One aspect of the present invention relates to a magnetic body containing soft magnetic alloy particles and having a high mechanical strength. Another aspect of the present invention relates to a coil component including such a magnetic body. A coil component according to one embodiment of the present invention includes: a magnetic body containing soft magnetic alloy particles; and a coil conductor disposed in the magnetic body or on the surface of the magnetic body. The magnetic body includes: first particles containing Fe and Cr as alloy components; second particles containing at least one of Al or Mn as alloy components; and bonding portions containing at least one of Al oxide or Mn oxide and bonding at least the first particles to each other. The first particles may contain Si as an alloy component. The second particles may contain Fe and Si as alloy components. In one or more embodiments of the present invention, the average particle size of the second particles may be smaller than that of the first particles. In one or more embodiments of the present invention, the average particle size of the second particles may be larger than that of the first particles. The first particles may have, in the surface thereof, an amorphous oxide film containing Si and Cr. The second particles may have, in the surface thereof, a crystalline oxide film containing at least one of Al oxide or Mn oxide.

Figure 1:
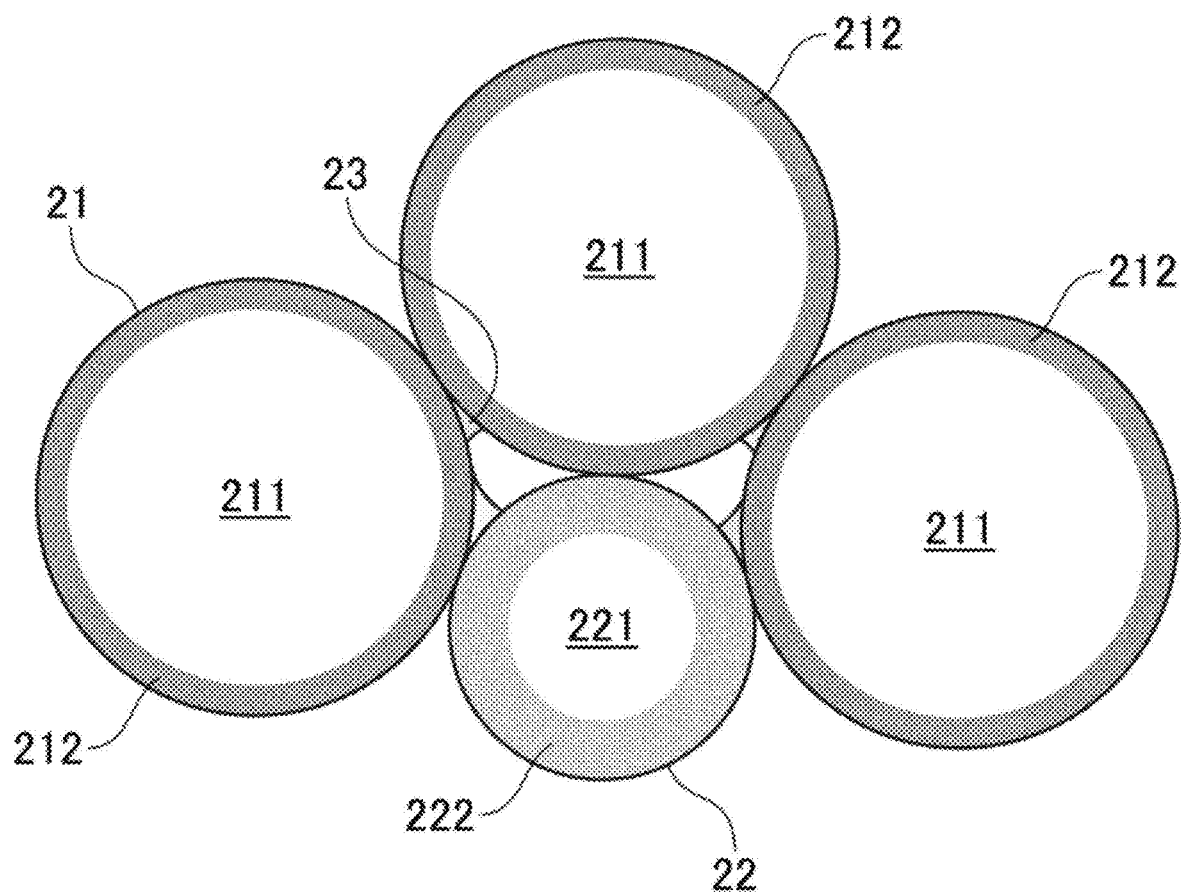
FIG. 1 schematically shows microstructure (an aspect of contact between unlike particles) of a magnetic body in a coil component according to one embodiment of the present invention.

As shown in FIG. 1, the magnetic body according to one embodiment of the present invention includes: the first particles 21 having the amorphous oxide film 212 in the surface thereof; the second particles 22 having the crystalline oxide film 222 in the surface thereof; and the bonding portions 23 containing at least one of Al oxide or Mn oxide. The average particle size of the second particles 22 may be either smaller or larger than that of the first particles.

The first particles 21 contain Fe and Cr as alloy components. In one embodiment, the alloy components of the first particles 21 substantially consists of Fe, Si, and Cr. The phrase "substantially consists of" means that no component other than inevitable impurities is included. The first particles 21 include: the amorphous oxide film 212 formed in the surface thereof; and an alloy portion 211 positioned inside the amorphous oxide film 212. Since the amorphous oxide film 212 has a small thickness and the proportion of the alloy portion 211 in the first particles 21 is relatively high, the magnetic characteristics of the magnetic body are provided mainly by the first particles 21 containing Fe as the main component. The proportion of the alloy components in the first particles 21 is not particularly limited. However, since better magnetic characteristics are obtained as the content of Fe is larger, it is preferable that the content of Fe is larger as long as the desired electrical insulation and oxidation resistance are obtained. The content of Fe is preferably 50 mass % or larger, or more preferably 70 mass % or larger. On the other hand, the content of Fe is preferably 98 mass % or smaller. The content of Si is preferably 1 mass % or larger in order to increase the electrical resistance of the alloy portion 211 to inhibit reduction of the magnetic characteristics caused by eddy currents. Further, the content of Cr is preferably 0.2 mass % or larger in order to inhibit oxidation of Fe in the alloy portion 211 to retain high magnetic characteristics. In one embodiment, the proportion by mass of Cr to the total of the metal elements and Si element in the first particles 21 is larger than the proportion by mass of the total of Al and Mn to the total of the metal elements and Si element in the second particles 22. This increases the electrical insulation of the amorphous oxide film 212.

The amorphous oxide film 212 in the surface of the first particles 21 contains Cr and O as constituent elements and is amorphous. The amorphous oxide film 212 may contain Si as a constituent element. When the amorphous oxide film 212 is an amorphous film containing Si, the amorphous oxide film 212 having a small thickness can provide the magnetic body with a high electrical insulation. Since the amorphous oxide film 212 contains Cr, it can be inhibited that oxidation of Fe in the alloy portion 211 reduces the characteristics. The amorphous oxide film 212 may contain elements other than Si, Cr, and O as long as it remains amorphous, and the types and amounts of such elements are not particularly limited. Accordingly, as will be described later, when the amorphous oxide film 212 is formed by adhesion of a Si-containing substance onto the surfaces of the first particles, the Si-containing substance may contain elements other than Si and Cr. In one or more embodiments of the present invention, the proportion by mass of Fe to the total of the metal elements and Si element in the amorphous oxide film 212 is smaller than the proportion by mass of the total of constituent elements of the amorphous oxide film 212 other than Fe to the total of the metal elements and Si element. When the proportion of Fe contained in the amorphous oxide film 212 is high, crystallization of the amorphous oxide film 212 is facilitated, resulting in significant reduction of electrical insulation of the magnetic body or the coil component. Therefore, it is preferable that the proportion of Fe contained in the amorphous oxide film 212 is low.

Figure 2:
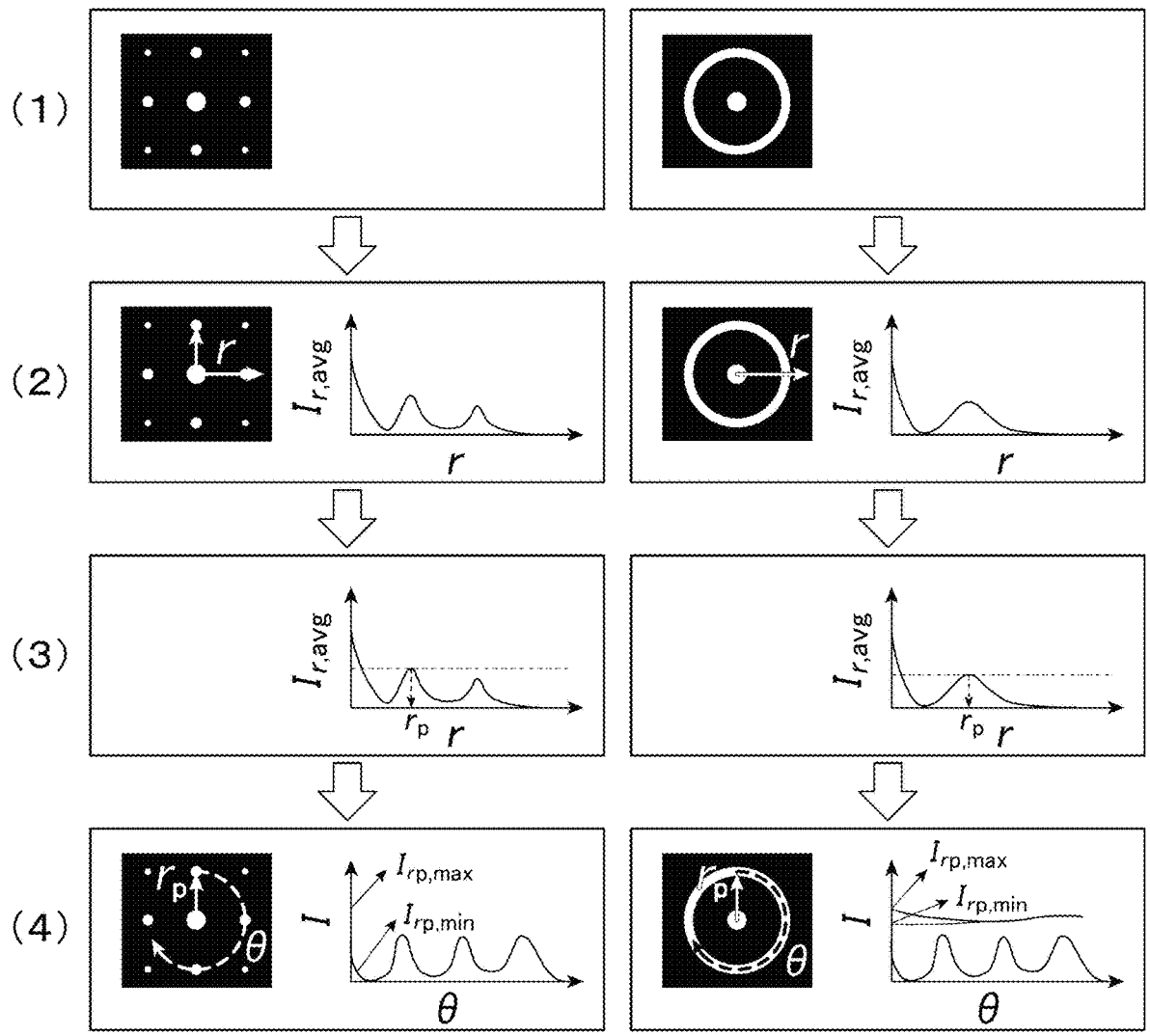
FIG. 2 shows a procedure for confirming that an insulating layer is amorphous in the present invention.

The following is the procedure for confirming that the insulating layer 212 is amorphous. First, a thin specimen cut from the magnetic body is observed with a high-resolution transmission electron microscope (HR-TEM). The insulating layer is recognized by the difference in contrast (brightness) in the electron microscope image, and the inverse spatial figure of the insulating layer is obtained by Fourier transform (see Part (1) in FIG. 2). Measurement apparatuses other than HR-TEM may be used as long as the inverse spatial figure is obtained by nanobeam diffraction. Next, in the obtained inverse spatial figure, the average value of the signal intensities $I_{r,avg}$ is calculated for each distance r from the beam incident position. Specifically, the signal intensity $I_r$ is measured at multiple points at an equal distance r from the beam incident position, and the measured values are averaged. Next, based on the obtained $I_{r,avg}$ and r, the dynamic diameter distribution function is obtained (see Part (2) in FIG. 2). Next, in the dynamic distribution function, the point rp is found where the signal intensity is maximum for r≠0 (see Part (3) in FIG. 2). Finally, the signal intensities measured at the multiple points at the distance rp from the beam incident position are plotted against the rotation angle θ. Among the signal intensities at the multiple points, the largest one $I_{rp,max}$ and the smallest one $I_{rp,min}$ are compared with each other (see Part (4) in FIG. 2). When the value of $I_{rp,max}$ is less than 1.5 times the value of $I_{rp,min}$, the observed insulating layer is determined to be amorphous.

The second particles 22 contains at least one of Al or Mn as an alloy component. The second particles 22 may contain Fe and Si as an alloy component, in addition to at least one of Al or Mn. The second particles 22 include: the crystalline oxide layer 222 formed in the surface thereof; and an alloy portion 221 positioned inside the crystalline oxide layer 222. Since the thickness of the crystalline oxide layer 222 is larger than that of the amorphous oxide film 212, the second particles 22 are firmly bonded to the adjacent soft magnetic alloy particles via the crystalline oxide layer 222. In this way, the second particles 22 contributes to increase of the mechanical strength of the magnetic body. Typically, a larger thickness of the oxide layer formed in the surfaces of the soft magnetic alloy particles results in a smaller proportion for the alloy portion. This is unfavorable for the magnetic characteristics. Therefore, in one embodiment, the average particle size of the second particles 22 is smaller than that of the first particles 21. The proportion of the alloy components in the second particles 22 is not particularly limited. However, in terms of retention of the magnetic characteristics, it is preferable that the content of Fe is larger as long as the desired electrical insulation and oxidation resistance are obtained. The suitable content of Fe is 30 mass % or larger, or it is preferably 50 mass % or larger, or more preferably 70 mass % or larger. On the other hand, the content of Fe is preferably 98 mass % or smaller. The content of Si is preferably 1 mass % or larger in order to increase the electrical resistance of the alloy portion 221 to inhibit reduction of the magnetic characteristics caused by eddy currents. The total content of Al and Mn is preferably 0.2 mass % or larger, in order to inhibit oxidation of Fe in the alloy portion 221 and the resultant reduction of the magnetic characteristics. In one embodiment, the proportion by mass of the total of Al and Mn to the total of the metal elements and Si element in the second particles 22 is larger than the proportion by mass of Cr to the total of the metal elements and Si element in the first particles 21. This results in a higher mechanical strength of the magnetic body.

The Al oxide and the Mn oxide has a high mechanical strength. Since the second particles contain at least one of Al or Mn as an alloy component, it is possible to strengthen the crystalline oxide layer 222 and the bonding portions 23 (described later), which contain at least one of the Al oxide or the Mn oxide.

The crystalline oxide layer 222 on the surface of the second particles 22 contain at least one of the Al oxide or the Mn oxide. The main component of the crystalline oxide layer 222 is at least one of Al or Mn. The term "main component" used herein refers to a component contained at the largest proportion by mass. As described above, the crystalline oxide layer 222 is firmly bonded to the first particles 21 or the second particles 22 adjacent thereto, and this contributes to increase of the mechanical strength of the magnetic body. The crystalline oxide layer 222 is preferably formed of a single crystal to further strengthen the magnetic body. The following is the procedure for confirming that the crystalline oxide layer 222 is formed of a single crystal.

First, a thin specimen with a thickness of 50 nm to 100 nm is extracted from the center of the coil component using a focused ion beam (FIB) system, followed immediately by observation of the magnetic body portion using a scanning transmission electron microscope (STEM) equipped with an annular dark field detector and an energy dispersive X-ray spectroscopy (EDS) detector. Next, the alloy portion located in the soft magnetic alloy particles is identified based on the difference in contrast (brightness) of the electron microscope image, and the composition of a 200 nm×200 nm area in the alloy portion is calculated by the ZAF method using EDS, and this composition is taken as the composition of the alloy portion. The STEM-EDS measurement conditions are as follows: an acceleration voltage of 200 kV, an electron beam diameter of 1.0 nm, and a measurement time set so that the integrated signal intensity in the range of 6.22 keV to 6.58 keV at each point in the alloy portion is 25 counts or larger. Next, when the obtained composition of the alloy portion includes at least one of Al or Mn, the soft magnetic alloy particle including this alloy portion is determined to be the second particle. Then, in the electron microscope image, the portion located near the surface of the soft magnetic alloy particle that is determined to be the second particle, and having a different contrast from the alloy portion is determined to be a layer of crystalline oxide, and the electron diffraction pattern of this layer is measured. When the diffraction pattern is a two-dimensional point array net pattern (lattice spots), the layer is determined to be formed of a single crystal.

The above method of determining the composition of the alloy portion can be used to determine the compositions of the amorphous oxide film 212 and the crystalline oxide layer 222.

The second particles 22 may have a smaller average particle size than the first particles 21. This inhibits deterioration of the magnetic characteristics of the magnetic body even when the crystalline oxide layer 222 is formed to a large thickness in the surface of the second particles 22. The ratio of the average particle size of the second particles 22 to that of the first particles 21 is preferably 0.02 to 0.5. When this ratio is 0.02 or higher, the bonding strength between the particles can be increased. On the other hand, when this ratio is 0.5 or lower, adverse effects on the magnetic characteristics can be inhibited. The average particle size may be, for example, 5 μm to 20 μm for the first particles and 0.1 μm to 2 μm for the second particles. The following is the procedure for calculating the average particle size of the particles.

The magnetic body may include more first particles 21 than the second particles 22. The magnetic body thus includes a larger proportion of the amorphous oxide film 212 having a high insulating quality, and therefore, the insulating quality of the magnetic body can be increased. Also, since the proportion of the first particles 21 is larger than that of the second particles 22, the magnetic characteristics of the magnetic body can be improved.

The magnetic body may include more second particles 22 than the first particles 21. The magnetic body thus includes a larger proportion of the crystalline oxide layer 222 that firmly bonds the particles to each other, resulting in a higher mechanical strength of the magnetic body.

First, the magnetic body of the coil component is ground to produce a sectional surface (ground surface). Next the ground surface is observed with a scanning electron microscope. The acceleration voltage for observation should be limited to about 2 kV to selectively obtain electron information near the surface of the ground surface. To make it easier to distinguish between the metal magnetic particle portions and the oxide film portions positioned between the particles, observation is performed using reflection electron images, and the resulting images are stored. The images are at a magnification of 2,000 to 5,000. Then, the EDS surface analysis is performed on the observed area to determine whether each particle is the first or second particle based on the differences in the elements contained. Then, the long and short diameters of the metal magnetic particles in the stored image are measured, and the average value of these two diameters is taken as the particle size of each metal magnetic particle. Finally, based on the obtained particle size and the result of the aforementioned determination of each particle, an arithmetic average value is calculated for each of the first particles 21 and the second particles 22, and these arithmetic average values are taken as the average particle size of the first particles 21 and the average particle size of the second particles 22, respectively. In addition, it can be determined which of the first particles 21 and the second particles 22 are more numerous in the magnetic body by counting the number of the first particles 21 and the number of the second particles 22 in the image obtained by scanning electron microscopy (SEM image). It is also possible to determine which of the first particles 21 and the second particles 22 are more numerous in the magnetic body by obtaining SEM images at five different locations in the magnetic body and comparing the average of the number of the first particles 21 in these five SEM images with the average of the number of the second particles 22.

Figure 3:
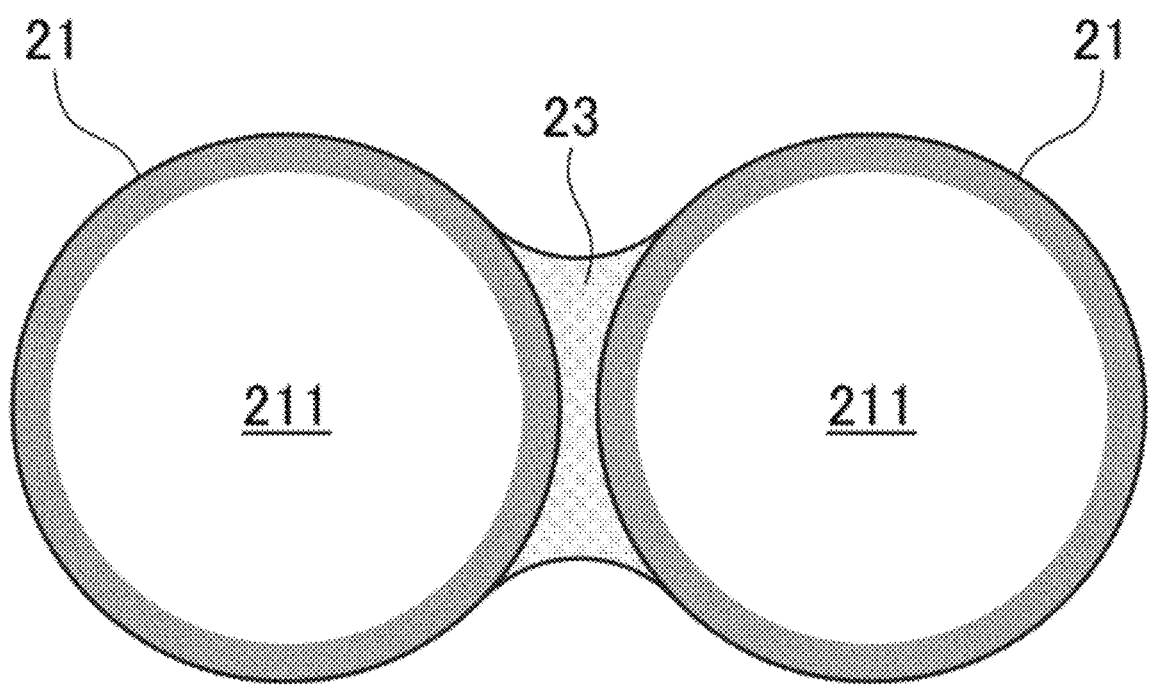
FIG. 3 schematically shows a magnetic body in which first particles are bonded together via a bonding portion.

As with the crystalline oxide layer 222, each of the bonding portions 23 contains at least one of Al oxide or Mn oxide, and the main component of the bonding portion 23 is at least one of Al or Mn. The bonding portion 23 is in contact with both adjacent first particles 21. This configuration can increase the bonding strength between the first particles 21. If the first particles 21 are bonded with each other via the amorphous oxide films 212, it is difficult to increase the bonding strength between the first particles 21. Since the bonding portion 23 is in contact with both adjacent first particles 21, the bonding strength between the first particles 21 can be increased. This results in a higher mechanical strength of the magnetic body. As shown in FIG. 3, the bonding portion 23 may be disposed between the first particles 21. Specifically, the adjacent first particles 21 are separated by the bonding portion 23 and thus do not contact directly with each other. In this case, the adjacent first particles 21 are bonded to each other via the bonding portion 23. This results in a higher mechanical strength of the magnetic body.

Figure 4:
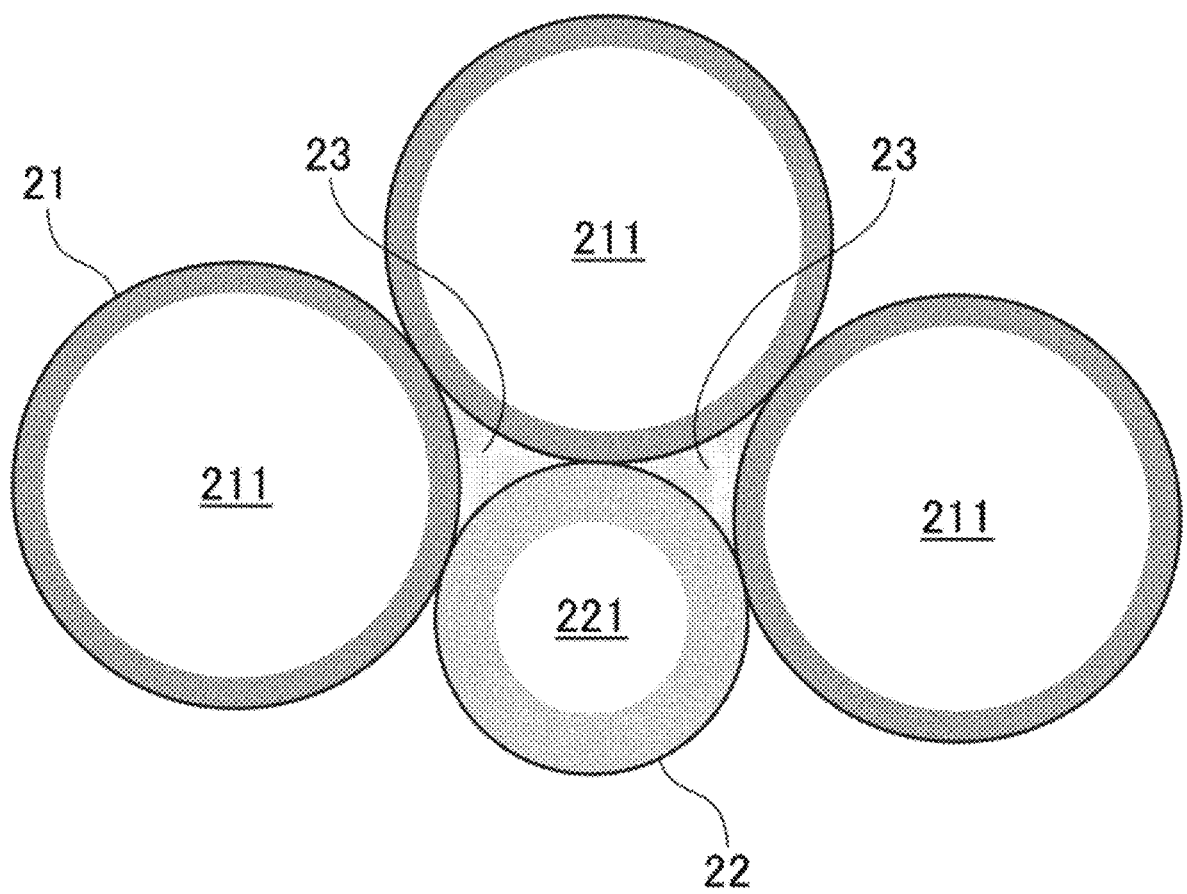
FIG. 4 schematically shows a magnetic body in which voids among the particles are filled by bonding portions.

FIG. 4 schematically shows arrangement of the first particles 21, the second particles 22, and the bonding portions 23 included in the magnetic body according to one embodiment of the present invention. As shown, in one embodiment of the present invention, the bonding portions 23 can fill the voids between the first particles 21 and between the first particles 21 and the second particles 22. When the second particles 22 are adjacent to each other, the bonding portion 23 can fill the voids between the second particles 22. This reduces the void ratio of the magnetic body and results in a higher mechanical strength of the magnetic body.

In one embodiment of the present invention, the proportion by mass of Si to the total of the metal elements and Si element in the amorphous oxide film 212 is larger than the proportion by mass of Si to the total of the metal elements and Si element in the bonding portion 23. This results in a higher electrical insulation of the amorphous oxide film 212. In one embodiment of the present invention, the proportion by mass of Si to the total of the metal elements and Si element in the crystalline oxide layer 222 is larger than the proportion by mass of Si to the total of the metal elements and Si element in the bonding portion 23. This results in a higher electrical insulation of the crystalline oxide layer 222.

Figure 5:
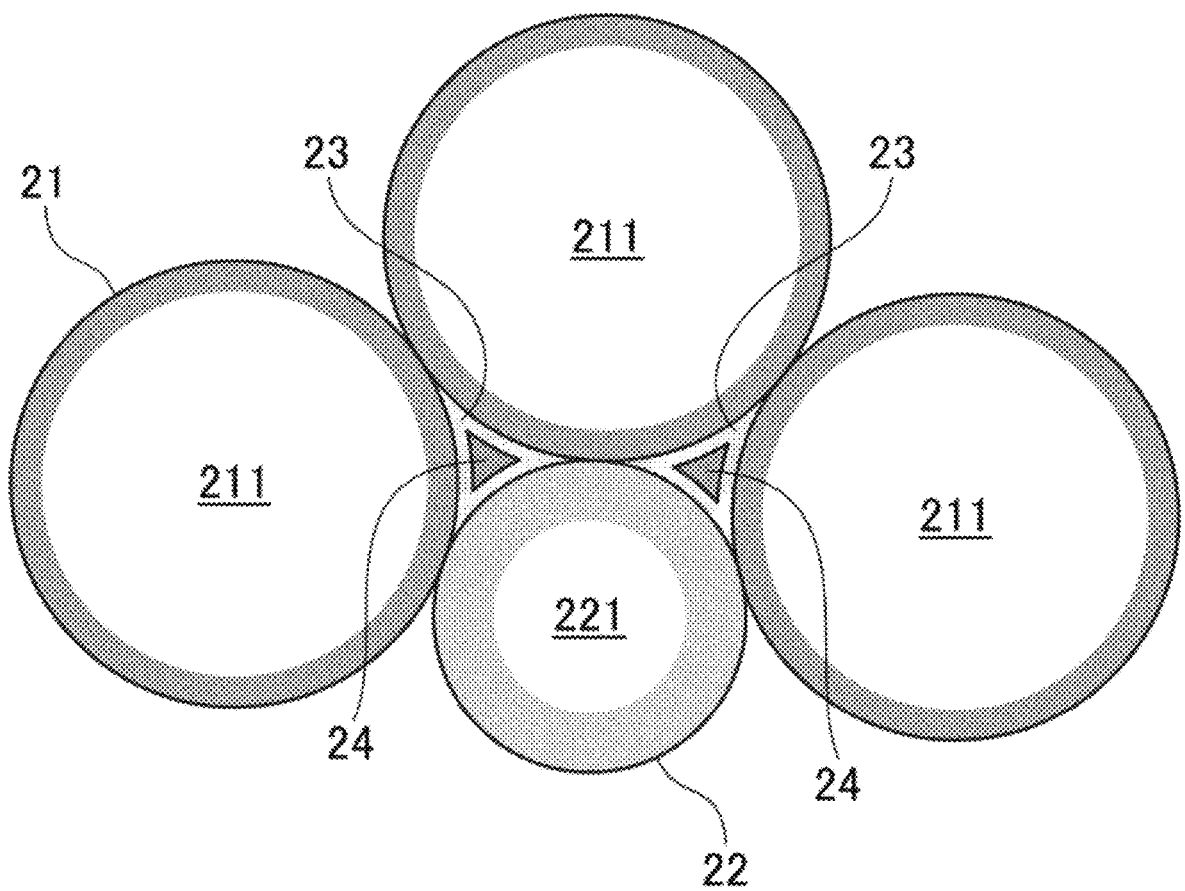
FIG. 5 schematically shows a magnetic body in which voids among the particles are filled by bonding portions and filling portions.

FIG. 5 is a diagram for explaining filling portions included in the magnetic body according to one embodiment of the present invention. As shown, the magnetic body according to one embodiment of the present invention includes the first particles 21, the second particles 22, the bonding portions 23, and the filling portions 24. Each of the filling portions 24 is an amorphous member containing Si oxide. In one or more embodiments of the present invention, the proportion by mass of Si to the total of the metal elements and Si element in the filling portion 24 is larger than the proportion by mass of Si to the total of the metal elements and Si element in the bonding portion 23. The filling portions 24 fill the voids among the first particles 21, the second particles 22, and the bonding portions 23. In the embodiment shown, the filling portions 24 are enclosed by the bonding portions 23. In another embodiment, at least a part of the filling portions 24 may be in contact with at least one of the first particles 21 or the second particles 22. The filling portions 24 can fill, along with the bonding portions 23, the voids among the first particles 21 and the second particles 22. The presence of the filling portions 24 containing Si oxide reduces the void ratio of the magnetic body. The void ratio of the magnetic body can be, for example, 2 vol % or lower. With the reduced void ratio of the magnetic body, the metal atoms contained in the coil conductor and the external electrodes are inhibited from migrating during the manufacture process of the coil conductor (described later).

The magnetic body according to the embodiments of the present invention may include soft magnetic metal particles other than the first particles and the second particles, and various fillers, as long as it retains the desired characteristics.

The material, shape, and arrangement of the coil conductor are not particularly limited and may be determined appropriately in accordance with the required characteristics. The material may be, for example, silver, copper, or an alloy of these. The shape may be, for example, linear, meander, flat coiled, or spiral. Further, by way of examples of the arrangement, a coated wire may be wound around the magnetic body, or a conductor having various shapes may be embedded in the magnetic body.

Next, a description is given of a manufacturing method of the magnetic body and the coil component including the magnetic body according to one embodiment of the invention. The manufacturing method includes the following process or operation.

(a) Soft magnetic alloy powders are prepared, namely, a first powder including an alloy component composed substantially of Fe, Si, and Cr, and a second powder including an alloy component composed of Fe, Si, and at least one of Al or Mn.

(d) The first powder and the second powder are mixed to obtain a mixed powder.

(e) The mixed powder obtained in operation (d) is molded into a molded body.

(f) The molded body obtained in operation (e) is heat-treated at a temperature of 500° C. to 900° C. in an atmosphere at an oxygen concentration of 10 ppm to 800 ppm, thereby to obtain the magnetic body.

(g) At least one of the following is performed: (1) in operation (e), placing a conductor or its precursor in or on the molded body, or (2) after operation (f), placing a conductor on the surface of the magnetic body.

A detailed description will be hereinafter given of the above essential operations and a part of optional operations added thereto. Naturally, in the second embodiment, the method may include an operation other than the operations described below that is known to those skilled in the art.

<As to Operation (a)>

This operation uses, as soft magnetic alloy powders, a first powder including an alloy component composed substantially of Fe, Si, and Cr, and a second powder including an alloy component composed of Fe, Si, and at least one of Al or Mn. This is based on the following finding obtained by the Inventor(s) in the course of completion of the present invention. The Inventor(s) found that soft magnetic alloy powders that contain only Cr as an element other than Si that is more easily oxidized than Fe form an oxide layer with a higher electrical insulation and a smaller thickness when heat-treated in a low oxygen atmosphere than soft magnetic alloy powders that contain such elements other than Cr, and the soft magnetic alloy powders that contain at least one of Al or Mn contribute to increase of mechanical strength of the magnetic body. Based on this finding, the Inventor(s) conceived a magnetic body including: first particles made of a first alloy containing Fe and Cr; second particles made of a second alloy containing at least one of Al or Mn; and bonding portions containing at least one of Al oxide or Mn oxide and bonding the first particles and the second particles together. This magnetic body exhibits a high mechanical strength while retaining the magnetic characteristics.

Both the first powder and the second powder contain Fe as an alloy component, and Fe contributes to the magnetic characteristics of the soft magnetic alloy particles constituting these powders. Therefore, both powders should preferably contain a larger amount of Fe as long as desired oxide is formed in the surface of the soft magnetic alloy particles by the heat treatment (described later). The content of Fe is preferably 50 mass % or larger, or more preferably 70 mass % or larger. On the other hand, when the content of Fe is excessive, its oxidation may cause failure to form desired oxide in the surfaces of the soft magnetic alloy particles constituting the powders. Therefore, the content of Fe is preferably 98 mass % or smaller.

Both the first powder and the second powder contain Si as an alloy component, and Si contributes to the electrical insulation of the soft magnetic alloy particles constituting these powders. Further, in the first powder, Si constitutes the main component of the amorphous oxide film having a high electrical insulation formed in the surface of the soft magnetic alloy particles by the heat treatment (described later). For the purpose of providing the soft magnetic alloy particles with a desired electrical insulation and forming the amorphous oxide film in the whole surface of the soft magnetic alloy particles (the first particles) constituting the first powder, the Si content in each powder is preferably 1 mass % or larger, more preferably 1.5 mass % or larger, or still more preferably 2 mass % or larger. On the other hand, for the purpose of retaining the magnetic characteristics of the soft magnetic alloy particles constituting the powders, the Si content is preferably 10 mass % or smaller, more preferably 8 mass % or smaller, or still more preferably 5 mass % or smaller.

The first powder contains Cr as an essential component, and Cr acts to inhibit oxidation of Fe in the soft magnetic alloy particles and inhibit resultant reduction of the magnetic characteristics. In addition, Cr in the soft magnetic alloy particles is diffused in the surfaces of the particles by the heat treatment (described later) and forms the amorphous oxide film 212 along with Si described above. This inhibits diffusion of oxygen into the alloy portion positioned in the inner part of the particles and also inhibits crystallization of the amorphous oxide film 212 caused by the oxidation and diffusion of Fe, thereby increasing the stability of the amorphous oxide film. For full performance of the above action, the Cr content in the first particles is preferably 0.2 mass % or larger, or more preferably 0.5 mass % or larger. On the other hand, for the purpose of increasing the proportion of Fe in the soft magnetic alloy particles and inhibiting segregation of Cr in the particles to obtain excellent magnetic characteristics, the content of Cr in the first particle is preferably 3 mass % or smaller, or more preferably 1.5 mass % or smaller.

The second powder contains at least one of Al or Mn as an essential component, which acts to inhibit oxidation of Fe in the soft magnetic alloy particles and resultant reduction of the magnetic characteristics, as with Cr described above. In addition, at least one of Al or Mn is diffused in the surfaces of the particles by the heat treatment (described later) and forms the crystalline oxide layer 222. This layer is formed to a larger thickness than the amorphous oxide film 212 described above. Therefore, the bonding strength between the second particles 22 and adjacent soft magnetic alloy particles (the first particles 21 or the second particles 22) is increased, as compared to bonding between the amorphous oxide films 212. Since the bonding portions 23 fill the voids among the particles, the volume of the voids among the particles is reduced, and the mechanical strength of the magnetic body is increased. In addition to the bonding portions 23, the filling portions 24 fill the voids among the particles, and therefore, the volume of the voids among the particles is further reduced, and the mechanical strength of the magnetic body is increased. Also, the proportion by mass of Si to the total of the metal elements and Si element in the filling portion 24 is larger than the proportion by mass of Si to the total of the metal elements and Si element in the bonding portion 23, and therefore, in addition to the bonding portions 23, the filling portions 24 filling the voids among the particles can further increase the electrical insulation of the magnetic body.

In one embodiment of the present invention, the proportion of Cr and the proportion of Al and Mn in the first powder and the second powder can be adjusted such that the proportion by mass of the total of Al and Mn to the total of the metal elements and Si element in the second particles 22 is larger than the proportion by mass of Cr to the total of the metal elements and Si element in the first particles 21. As a result, the proportion of at least one of Al or Mn can be larger in the magnetic body after the heat treatment, and thus the magnetic body can have excellent magnetic characteristics and an excellent mechanical strength. In one embodiment, the presence of the crystalline oxide film of Al and/or Mn allows the void ratio of the magnetic body to be 5 vol % or lower. Since Al and Mn have a lower reaction temperature and a higher reaction rate than Cr, when the proportion by mass of the total of Al and Mn to the total of the metal elements and Si element in the second particles 22 is larger than the proportion by mass of Cr to the total of the metal elements and Si element in the first particles 21, a larger amount of crystalline oxide layer 222 containing at least one of Al oxide or Mn oxide can be produced in the voids among the first particles 21 and the second particles 22 during the heating operation for manufacturing the magnetic body. In this way, the voids among the first particles 21 and the second particles 22 can be reduced. In the heating operation for manufacturing the magnetic body, the crystalline oxide layer 222 begins to be formed at a relatively low temperature, and as the temperature rises, the amorphous oxide film 212 is formed.

The second powder may have a smaller average particle size than the first powder. This makes it possible to inhibit the adverse effects on the magnetic characteristics even when the crystalline oxide layer is formed to a large thickness in the surfaces of the soft magnetic alloy particles during the heat treatment (described later). The ratio of the average particle size of the second powder to that of the first powder is preferably 0.02 to 0.5. When this ratio is 0.02 or higher, the bonding strength between the particles can be fully increased by forming the crystalline oxide layer. On the other hand, when this ratio is 0.5 or lower, the adverse effects on the magnetic characteristics can be inhibited. The average particle size may be, for example, 5 μm to 20 μm for the first particles and 0.1 μm to 2 μm for the second particles. The average particle size can be measured, for example, using a particle size analyzer that utilizes the laser diffraction/scattering method.

<As to Operation (d)>

In operation (d), the first powder and the second powder are mixed to obtain a mixed powder. In this operation, it is also possible to mix a soft magnetic metal powder other than the first powder and the second powder, and various fillers, as long as the obtained magnetic body has the desired characteristics. Any conventional method for mixing powders can be used to mix the first powder and the second powder. By way of one example, it is possible to use mixers such as ribbon blenders or V-type mixers or use ball mills for mixing.

<As to Operation (e)>

In operation (e), the mixed powder obtained in operation (d) is molded into a molded body. The molding method is not particularly limited. For example, the mixed powder is mixed with a resin, and this mixture is placed into a mold such as a die and pressed by a pressing machine, followed by curing of the resin. Another possible method is to stack and pressure-bond green sheets containing the mixed powder.

When the molded body is formed by press-molding using a die, the condition of pressing may be determined appropriately in accordance with the types of the mixed powder and the resin mixed therewith and the ratio of combination of these. The resin mixed with the mixed powder may be any resin that bonds the soft magnetic alloy particles constituting the mixed powder for molding and retaining the shape and volatilizes during the heat treatment in operation (f) without leaving any carbon component and the like. Examples of such a resin include acrylic resins, butyral resins, and vinyl resins with a decomposition temperature of 500° C. or lower. The resin may be used with or replaced with lubricants represented by stearic acid or salts thereof, phosphoric acid or salts thereof, and boric acid and salts thereof. The amount of the resin or the lubricant added may be determined appropriately so as to facilitate molding and retention of the shape. For example, the amount may be 0.1 to 5 parts by mass relative to 100 parts by mass of the soft magnetic alloy powder. The resin mixed with the mixed powder may be a silicon resin. The silicon resin is extruded by the molding pressure into the voids among the soft magnetic alloy particles constituting the mixed powder (what is called the triple points each surrounded by three particles in cross-sectional view), and thus the silicon resin is present mainly in these triple points.

When the green sheets are stacked and pressure-bonded to obtain the molded body, a method may be employed that includes stacking each green sheet using a vacuum conveyor or the like and pressure-bonding the green sheets using a pressing machine. For producing multiple coil components from the laminated body obtained by pressure-bonding, the laminated body may be diced by a cutter such as a dicing machine or a laser cutting machine. In this case, the green sheets are typically manufactured as follows: a slurry containing the soft magnetic alloy powder and a binder is applied to the surface of a base film such as a plastic film by a coater such as a doctor blade or a die coater and then dried. Any binder may be used that can allow the soft magnetic alloy powder to be molded into a sheet-like shape and retain this shape, and can be removed by heating without leaving any carbon component and the like. Examples of such a resin include polyvinyl butyral and other polyvinyl acetal resins. A solvent for preparing the slurry is also not particularly limited, and examples of usable solvent include butylcarbitol and other glycol ethers. The contents of the components in the slurry can be appropriately adjusted in accordance with the employed method of molding the green sheets and the thickness of the green sheets to be prepared.

<As to Operation (f)>

In operation (f), the molded body obtained in operation (e) is heat-treated at a temperature of 500° C. to 900° C. in an atmosphere at an oxygen concentration of 10 ppm to 800 ppm, thereby to obtain the magnetic body. In this operation, the resin (binder) in the molded body is removed by volatilization, and the crystalline oxide is produced in the surfaces of the soft magnetic alloy particles constituting the second powder (the second particles) to bond the soft magnetic alloy particles to each other. The heat treatment for removing the resin (binder) in the molded body by volatilization may be performed prior to and separately from operation (f). In this case, it is preferable that the atmosphere of heat treatment has an oxygen concentration of 10 ppm or higher, and the heat treatment temperature is 400° C. or lower for inhibiting oxidation of Fe. When the molded body contains a silicon resin, the silicon resin remains in the molded body while the molded body is heated to remove the binder in the molded body by volatilization. The silicon resin remaining in the molded body is gradually decomposed in the course of the heat treatment, but not all is decomposed, and some remains as a filler containing Si in the regions called triple points among the particles.

The oxygen concentration in the heat treatment atmosphere is 10 ppm to 800 ppm. Since the oxygen concentration in the heat treatment atmosphere is 10 ppm or higher, it is possible to oxidize the surfaces of the soft magnetic alloy particles constituting the soft magnetic alloy powder, thereby electrically insulating the particles from each other and bonding the particles to each other via the oxides. For the purpose of facilitating the oxidation of at least one of Al or Mn in the soft magnetic alloy particles constituting the second powder (the second particles) to produce an adequate amount of crystalline oxide 222 and bond firmly the soft magnetic alloy particles to each other, the oxygen concentration is preferably 100 ppm or higher, or more preferably 200 ppm or higher. On the other hand, since the oxygen concentration in the heat treatment atmosphere is 800 ppm or lower, it is possible to inhibit oxidation of Fe in the soft magnetic alloy particles constituting the first powder (the first particles) and the resultant production of the crystalline oxide 212 in the surfaces of these particles. The above oxygen concentration is preferably 500 ppm or lower, or more preferably 300 ppm or lower. In the above heat treatment operation, as the heat treatment temperature rises, the silicon resin remaining in the triple points of the soft magnetic alloy particles forms filling portions 24 that contain Si oxide and are amorphous. The filling portions 24 may be formed so as to be surrounded by the crystalline oxide 222 containing at least one of Al or Mn. Since the amorphous oxide film containing Al, Mn has a low reaction temperature and a high reaction rate, the crystalline oxide layer 222 and the bonding portions 23 begin to be formed in and on the surfaces of the second particles 22 at an early stage of the heat treatment (at a low heat treatment temperature). As the heat treatment operation progresses and the heat treatment temperature rises, amorphous filling portions 24 are formed in the triple points between the particles after molding. The filling portions 24 contain Si oxide made from the silicon resin remaining in these regions. In this way, the heat treatment operation includes first forming the crystalline oxide layer 222 and the bonding portions 23 and then forming the filling portions 24. Therefore, the filling portions 24 are surrounded by the crystalline oxide 222 and the bonding portions 23.

The heat treatment temperature is 500° C. to 900° C. Since the heat treatment temperature is 500° C. or higher, it is possible to oxidize the surfaces of the soft magnetic alloy particles constituting the soft magnetic alloy powder, thereby electrically insulating the particles from each other and bonding the particles to each other via the oxides. The heat treatment temperature is preferably 550° C. or higher, or more preferably 600° C. or higher. On the other hand, since the heat treatment temperature is 900° C. or lower, it is possible to inhibit oxidation of Fe in the soft magnetic alloy particles constituting the first powder (the first particles) and the resultant production of the crystalline oxide in the surfaces of these particles. The heat treatment temperature is preferably 850° C. or lower, or more preferably 800° C. or lower.

The heat treatment time should be set such that the crystalline oxide formed on the surfaces of the second particles grows to reach the contact portions between the first particles. For example, the heat treatment time may be 30 minutes or more, and it is preferably one hour or more. On the other hand, the heat treatment time may be five hours or less, and it is preferably three hours or less, for the purpose of preventing the production of the crystalline oxide films in the surfaces of the first particles and shortening the time of the heat treatment for higher productivity.

The oxidation of Fe in the soft magnetic alloy particles constituting the first powder (the first particles) and the resultant production of the crystalline oxide in the surfaces of these particles can be inhibited by lowering at least one of the oxygen concentration in the heat treatment atmosphere or the heat treatment temperature or shortening the heat treatment time. Therefore, for minimizing the production of the crystalline oxide when the oxygen concentration in the heat treatment atmosphere needs to be high, it is effective to lower the heat treatment temperature or shorten the heat treatment time. When the heat treatment temperature needs to be high, it is effective to lower the oxygen concentration in the heat treatment atmosphere or shorten the heat treatment time. Further, when the heat treatment time needs to be long, it is effective to lower the oxygen concentration in the heat treatment atmosphere or lower the heat treatment temperature.

<As to Operation (g)>

In operation (g), the coil conductor or its precursor is placed. The coil conductor may be hereinafter referred to simply as "the conductor." The conductor will undergo no further treatment until it is complete as the conductor in the coil component, whereas the precursor of the conductor, which contains a binder resin and the like in addition to the conductive material that forms the conductor in the coil component, will be heat-treated to form the conductor. There are two methods of placing the conductor or its precursor, which will be described below.

(1) In operation (e), the conductor or its precursor is placed in or on the molded body. When the molded body is formed by press-molding as mentioned above, the mixed powder of the soft magnetic alloys may be filled into a die having the conductor or its precursor previously placed therein, and then the die may be pressed. In this way, the conductor or its precursor can be placed in the molded body.

When the molded body is formed by stacking and pressure-bonding the green sheets as mentioned above, the precursor of the conductor may be placed by printing a conductive paste on the green sheets, and then the green sheets may be stacked and pressure-bonded. In this way, the conductor or its precursor can be placed in or on the molded body. The conductive paste used may contain conductive powder and an organic vehicle. The conductive powder may be, for example, powder of silver, copper, or an alloy of these. The particle size of the conductive powder is not particularly limited, but for example, the average particle size (median diameter (D50)) may be 1 μm to 10 μm, which is calculated from the particle size distribution measured on a volume basis. The composition of the organic vehicle may be determined in view of compatibility with the binder contained in the green sheets. One example is polyvinyl acetal resin, such as polyvinyl butyral (PVB), dissolved or swollen in a glycol ether solvent such as butyl carbitol. The ratio of the conductive powder to the organic vehicle in the conductive paste can be adjusted in accordance with the paste viscosity suitable for the printing machine used and the film thickness of the conductor pattern to be formed.

In any of the cases described above, the placed precursor of the conductor forms the conductor through the subsequent operation (f).

(2) After operation (f), the conductor is placed on the surface of the magnetic body. In this case, the conductor can be placed by the following methods: a coated wire may be wound around the magnetic body obtained, or the precursor of the conductor may be placed by printing a conductive paste on the surface of the magnetic body, followed by baking in a heating apparatus such as a baking furnace.

<As to Operation (b)>

In the second embodiment, prior to operation (d), Si-containing substance may be adhered (operation (b)) to the surfaces of the particles constituting the first powder (the first particles) prepared in operation (a).

In operation (b), Si-containing substance is adhered to the surfaces of the particles constituting the first powder (the first particles). This facilitates production of the amorphous films on the surfaces of the first particles to a uniform thickness. Examples of the Si-containing substance used include silane coupling agents, such as tetraethoxysilane (TEOS), and silica particles, such as colloidal silica. The amount of Si-containing substance used may be determined appropriately in accordance with its type or the particle size of the soft magnetic alloy particles, for example. Examples of the method for adhering the Si-containing substance to the surfaces of the soft magnetic alloy particles constituting the first powder (the first particles) are as follows. When the Si-containing substance is liquid, the particles are sprayed or immersed and then dried. Alternatively, when the Si-containing substance is fine particles, the first particles are dry-blended with the Si-containing substance or contacted with (sprayed with or immersed in) a slurry having the Si-containing substance dispersed therein and then dried. Further, it is also possible to apply a coating by the sol-gel process using silane coupling agents.

<As to Operation (c1)>

When operation (b) is performed, the first powder having gone through operation (b) may be heat-treated in an inert gas atmosphere at a temperature of 100° C. to 700° C., or in an atmosphere having an oxygen concentration of 100 ppm or lower at a temperature of 100° C. to 300° C. (operation (c1)). The inert gas refers to N2 or rare gases. As a result, the Si-containing substance adhered to the surfaces of the alloy particles constituting the first powder (the first particles) forms amorphous films containing Si and O, and the films formed have an increased mechanical strength or adhesion strength to the metal particles. These films serve as insulating layers in the magnetic body included in the coil component. Specifically, these films electrically insulate the soft magnetic alloy particles from each other.

The heat treatment temperature is preferably 100° C. or higher. This facilitates formation of the amorphous films described above. Also, the films formed have an increased mechanical strength or adhesion strength to the metal particles. However, if the heat treatment temperature is too high, oxidation of the soft magnetic metal powder and crystallization of the amorphous films will be noticeable, and the characteristics of the obtained magnetic body will deteriorate. Therefore, for heat treatment in an atmosphere containing 100 ppm or less oxygen, the heat treatment temperature is preferably 300° C. or lower. On the other hand, in the heat treatment in an inert gas atmosphere, almost no oxidation of the soft magnetic metal powder occurs, and thus the upper limit of the heat treatment temperature can be 700° C.

The time for which the heat treatment temperature should be retained is not particularly limited, but it is preferably 30 minutes or more, or more preferably 50 minutes or more, for the purpose of sufficient formation of the amorphous films and sufficient increase of the mechanical strength of the films formed or the adhesion strength to the metal particles. On the other hand, the heat treatment time is preferably 2 hours or less, or more preferably 1.5 hours or less, for the purpose of inhibiting the production of the crystalline film and shortening the time of the heat treatment for higher productivity.

<As to Operation (c2)(1)>

In the second embodiment, operation (c1) described above may be replaced with operation (c2) in which the first powder having the Si-containing substance adhered to the particle surfaces may be heat-treated in an atmosphere having an oxygen concentration of 3 ppm to 100 ppm at a temperature of 300° C. to 900° C. This causes Si or Cr in the alloy particles constituting the first powder (the first particles) to diffuse toward the surfaces of the particles and oxidize at the surfaces. At this time, amorphous oxide films are formed in the surfaces of the first particles, and these amorphous oxide films constitute amorphous films having a sufficient thickness along with the amorphous films formed from the Si-containing substance. These films serve as insulating layers in the magnetic body included in the coil component. Specifically, these films electrically insulate the first particles having these films formed thereon from other alloy particles adjacent thereto. Therefore, the magnetic body or coil component obtained can have a high electrical insulation and a small driving loss.

Since the oxygen concentration in the heat treatment atmosphere is 3 ppm or higher and the heat treatment temperature is 300° C. or higher, the reaction between the alloy components, Si and Cr, and oxygen can be facilitated. This makes it possible to coat the surfaces of the soft magnetic alloy particles constituting the first powder (the first particles) with the amorphous films having a high electrical insulation. On the other hand, since the oxygen concentration in the heat treatment atmosphere is 100 ppm or lower and the heat treatment temperature is 900° C. or lower, it is possible to inhibit excessive oxidation of Fe in the first particles and the resultant production of the crystalline oxide in the surfaces of these particles. This prevents deterioration of the magnetic characteristics and the electrical insulation. The above oxygen concentration is preferably 5 ppm or higher. The above oxygen concentration is preferably 50 ppm or lower, or more preferably 30 ppm or lower, or further preferably 10 ppm or lower. On the other hand, the heat treatment temperature is preferably 350° C. or higher, or more preferably 400° C. or higher. The heat treatment temperature is preferably 850° C. or lower, or more preferably 800° C. or lower.

The time for which the heat treatment temperature should be retained is not particularly limited, but it is preferably 30 minutes or more, or more preferably 1 hour or more, for the purpose of forming the amorphous films to a sufficient thickness. On the other hand, the heat treatment time is preferably 5 hours or less, or more preferably 3 hours or less, for the purpose of inhibiting the production of the crystalline films and shortening the time of the heat treatment for higher productivity.

The above-mentioned excessive oxidation of Fe in the first particles and the resultant production of the crystalline oxide in the surfaces of the first particles can be inhibited by lowering at least one of the oxygen concentration in the heat treatment atmosphere or the heat treatment temperature or shortening the heat treatment time. Therefore, for minimizing the oxidation of Fe when the oxygen concentration in the heat treatment atmosphere needs to be high, it is effective to lower the heat treatment temperature or shorten the heat treatment time. When the heat treatment temperature needs to be high, it is effective to lower the oxygen concentration in the heat treatment atmosphere or shorten the heat treatment time. Further, when the heat treatment time needs to be long, it is effective to lower the oxygen concentration in the heat treatment atmosphere or lower the heat treatment temperature.

<As to Operation (c2)(2)>

Operation (c2) may be performed on the first powder not having gone through operation (b). In this way, the amorphous oxide films containing Si, Cr, and O can be formed to a uniform thickness in the surfaces of the soft magnetic alloy particles constituting the first powder (the first particles). These films serve as insulating layers in the magnetic body included in the coil component. Specifically, these films electrically insulate the soft magnetic alloy particles from each other. Therefore, the magnetic body or coil component obtained can have a uniform thickness of the insulation layers and excellent magnetic characteristics. Further, in this case, the thickness of the insulating layers can be smaller than in the case where operation (b) is performed, and therefore, it is possible to increase the proportion of the alloy portion in the first particles and thus improve the magnetic characteristics of the magnetic body or coil component obtained.

When a silicon resin is used as the resin to be mixed with the mixed powder, the magnetic body obtained by the heat treatment includes the amorphous filling portions 24 containing Si oxide disposed among the first particles 21, the second particles 22, and the bonding portions 23. The presence of the filling portions 24 containing Si oxide reduces the void ratio of the magnetic body, as compared to the case where no filling portions 24 are provided. For example, it reduces the void ratio to 2 vol % or lower. With the reduced void ratio of the magnetic body, the metal atoms contained in the coil conductor and the external electrodes are inhibited from migrating. Also, the proportion by mass of Si to the total of the metal elements and Si element in the filling portion 24 is larger than the proportion by mass of Si to the total of the metal elements and Si element in the bonding portion 23, and therefore, the electrical insulation of the magnetic body can be increased.

The manufacturing method described above produces a magnetic body in which the first particles 21 having formed on the surfaces thereof the amorphous oxide films with a high electrical insulation are bonded with the second particles 22 via the crystalline oxide (the crystalline oxide layers 222 and the bonding portions 23) having a high mechanical strength. This makes it possible to obtain a magnetic body having a high mechanical strength and a coil component including the magnetic body.

An aspect of the present invention relates to a circuit board having installed thereon the coil component according to one embodiment of the present invention. The structure and the like of the circuit board is not limited but may be chosen in accordance with the application. The third embodiment uses the coil component according to the first embodiment, thereby resisting vibration and impacts.

EXAMPLES

Examples hereinafter described will illustrate the present invention more specifically, but the present invention is not limited to these Examples.

Example 1

Preparation of Coil Component and Test Magnetic Body

Figure 6:
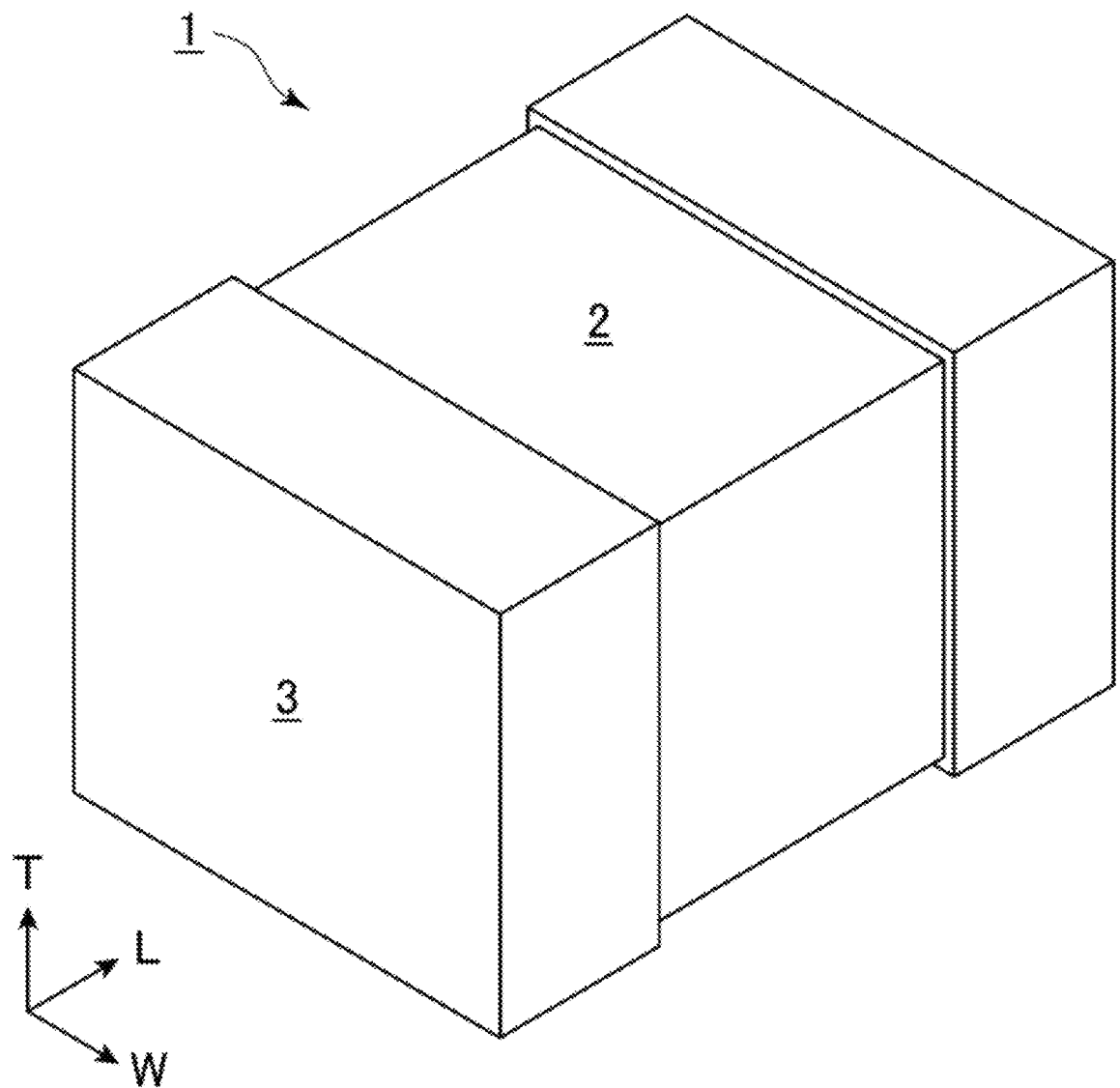
FIG. 6 schematically shows an external appearance of a coil component produced in Examples and Comparative Examples of the present invention.

The first powder was prepared, which was a soft magnetic alloy powder having an average particle size of 4 μm and containing 95.0 wt % Fe, 2.0 wt % Si, and 3.0 wt % Cr, with a remainder constituted by inevitable impurities. Also, the second powder was prepared, which was a soft magnetic alloy powder having an average particle size of 2 μm and containing 97.0 wt % Fe, 2.0 wt % Si, and 1.0 wt % Al, with a remainder constituted by inevitable impurities. Next, the first powder was heat-treated for 1 hour at 700° C. in an atmosphere having an oxygen concentration of 7 ppm. Next, 90 parts by mass of the first powder having gone through the heat treatment was mixed with 10 parts by mass of the second powder, a polyvinyl butyral (PVB)-based binder resin, and a dispersion medium to prepare a slurry, and the slurry was formed into a sheet-like shape by an automatic coater to obtain green sheets. Next, an Ag paste was printed on each green sheet to form a precursor of an internal conductor. Next, the green sheets were stacked and pressure-bonded, and then diced into a molded body. Next, the molded body was heat-treated for 1 hour at 800° C. in an atmosphere having an oxygen concentration of 800 ppm to obtain a magnetic body including the internal conductor. Finally, external electrodes connecting to the internal conductor was formed, and thus the coil component shaped as shown in FIG. 6 was obtained. Also, another set of green sheets having no precursor of the internal conductor formed thereon was stacked and pressure-bonded, and then formed into a disc-like shape. This molded body was heat-treated under the above conditions to obtain a test magnetic body having a disc-like shape with a diameter of 7 mm and a thickness of 0.5 mm to 0.8 mm. Further, still another set of green sheets having no precursor of the internal conductor formed thereon was stacked and pressure-bonded, and then formed into a rectangular parallelepiped shape. This molded body was heat-treated under the above conditions to obtain a test magnetic body having a rectangular parallelepiped shape with a length of 50 mm, a width of 5 mm, and a thickness of 4 mm.

<Measurement of Average Particle Size of Soft Magnetic Alloy Particles>

In the coil component obtained, the average particle sizes of the first particles and the second particles of the soft magnetic alloy were measured by the method described above. The average particle size of the first particles was 4 μm, and that of the second particles was 2 μm.

<Observation of Structure and Composition of Oxide Film and Oxide Layer>

In the coil component obtained, the structure and the composition of the oxide films or the oxide layers formed in the surfaces of the soft magnetic alloy particles in the magnetic body were observed by the method described above. As a result, it was found that amorphous oxide films containing Si and Cr were formed in the surfaces of the first particles. Also, it was found that layers of crystalline oxide composed mainly of Al($Al_2O_3$) were formed in the surfaces of the second particles. Further, it was confirmed that the same oxide as that formed in the surfaces of the second particles was formed on the contact portions between the first particles so as to extend across the first particles in contact with each other.

<Measurement of Permeability>

In the coil component obtained, the relative permeability was measured at a frequency of 10 MHz using L-chromometer (4285A from Agilent Technologies, Inc.) as a measurement apparatus. The relative permeability measured was 32.

<Evaluation of Electrical Insulation>

The electrical insulation of the coil component was evaluated from the volume resistivity and the breakdown voltage of the test magnetic body shaped like a disc described above. The evaluation sample was prepared by forming an Au film by sputtering on the whole opposite surfaces of the test magnetic body shaped like a disc described above. In the evaluation sample obtained, the volume resistivity was measured in conformity to JIS-K6911. With the Au films formed on the opposite surfaces of the sample used as electrodes, a voltage was applied between the electrodes so that the electric field strength was 60 V/cm, and the resistance value was measured. The volume resistivity was calculated from the resistance value. The volume resistivity of the evaluation sample was 500 Ω·cm. The breakdown voltage of the evaluation sample obtained was measured by applying a voltage between the Au films used as the electrodes formed on the opposite surfaces of the sample and measuring the electric current value. The applied voltage was raised gradually while measuring the electric current value, and when the electric current density calculated from the electric current value is 0.01 A/$cm^2$, the electric field strength calculated from the voltage being applied was determined as the breakdown voltage. The breakdown voltage of the evaluation sample was 6.2 kV/cm.

<Evaluation of Mechanical Strength>

Figure 7:
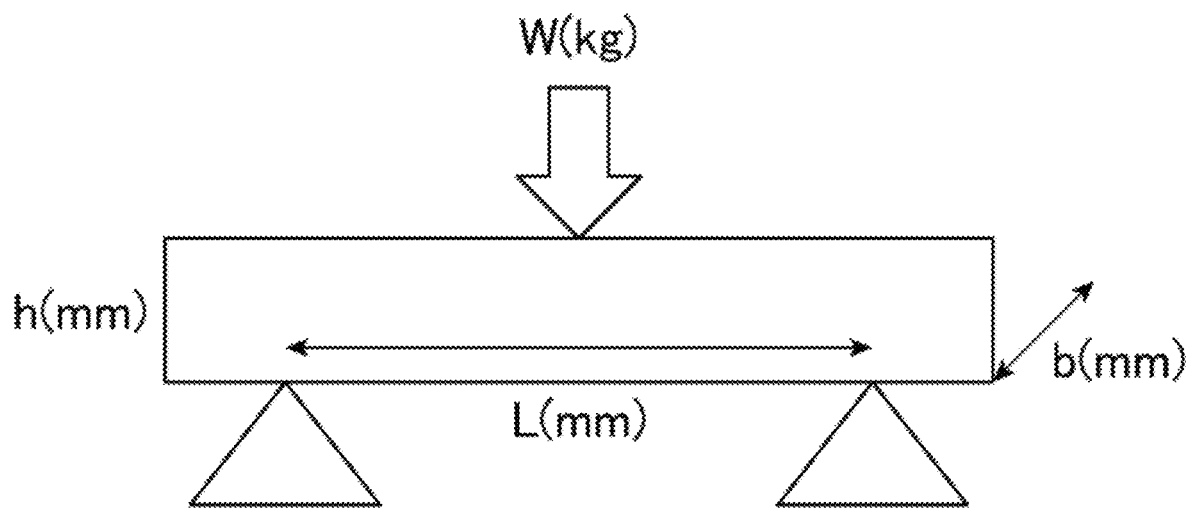
FIG. 7 schematically shows how a specimen is supported and loaded in a three-point bending test performed in Examples and Comparative Examples of the present invention.

The mechanical strength of the coil component was evaluated by a three-point bending test on the test magnetic body (specimen) having a rectangular parallelepiped shape described above. As shown in FIG. 7, the specimen was supported and loaded. The load being applied when the specimen was broken was taken as the maximum load W. The breaking stress ob was calculated from the maximum load W by Formula 1 below, taking account of the bending moment M and the second moment of area I. The foregoing test was performed on ten specimens, and an average of the breaking stresses ob was taken as the breaking stress of the magnetic body related to Example 1. The breaking stress obtained was 17 kgf/$mm^2$.

$$\sigma_b = \left(\frac{M}{I}\right) \times \left(\frac{h}{2}\right) = \frac{3WL}{2bh^2} \quad \text{Formula (1)}$$

Example 2

Preparation of Coil Component and Test Magnetic Body

A coil component and a test magnetic body related to Example 2 were prepared by the same method as for Example 1, except for the following point. Prior to mixture with the second powder, the binder resin, and the dispersion medium, the first powder was dispersed in a mixed solution containing ethanol and ammonia water, and then this was mixed with a treatment solution containing tetraethoxysilane (TEOS), ethanol, and water. The resultant mixture was stirred and filtered for separation of the first powder. The separated first powder was then dried. The first powder having gone through this treatment was mixed with the second powder, the binder resin, and the dispersion medium. The conditions for the heat treatment of the molded body were the oxygen concentration in the atmosphere of 800 ppm, 800° C., and 1 hour.

<Observation of Structure and Composition of Oxide Film and Oxide Layer>

In the coil component obtained, the structure and the composition of the oxide films or the oxide layers formed in the surfaces of the soft magnetic alloy particles in the magnetic body were observed by the same method as for Example 1. It was confirmed that the oxide films and the oxide layers having the same structure and composition as in Example 1 were formed.

<Evaluation of Coil Component and Test Magnetic Body>

The characteristics of the coil component and the test magnetic body obtained were measured by the same method as for Example 1. The coil component had a relative permeability of 30, the evaluation sample had a resistivity of 510 Ω·cm and a breakdown voltage of 5.6 kV/cm, and the magnetic body had a breaking stress of 16 kgf/$mm^2$, which was evaluated by the three-point bending test.

Example 3

Preparation of Coil Component and Test Magnetic Body

A coil component and a test magnetic body related to Example 3 were prepared by the same method as for Example 1, except that the first powder was not heat-treated before it was mixed with the second powder, the binder resin, and the dispersion medium to prepare a slurry.

<Observation of Structure and Composition of Oxide Film and Oxide Layer>

In the coil component obtained, the structure and the composition of the oxide films or the oxide layers formed in the surfaces of the soft magnetic alloy particles in the magnetic body were observed by the same method as for Example 1. It was confirmed that the oxide films and the oxide layers having the same structure and composition as in Example 1 were formed.

<Evaluation of Coil Component and Test Magnetic Body>

The characteristics of the coil component and the test magnetic body obtained were measured by the same method as for Example 1. The coil component had a relative permeability of 34, the evaluation sample had a resistivity of 470 Ω·cm and a breakdown voltage of 5.2 kV/cm, and the magnetic body had a breaking stress of 17 kgf/$mm^2$, which was evaluated by the three-point bending test.

Example 4

Preparation of Coil Component and Test Magnetic Body

The first powder was prepared, which was a soft magnetic alloy powder having an average particle size of 4 μm and containing 97.8 wt % Fe, 2.0 wt % Si, and 0.2 wt % Cr, with a remainder constituted by inevitable impurities. Also, the second powder was prepared, which was a soft magnetic alloy powder having an average particle size of 2 μm and containing 97.0 wt % Fe, 2.0 wt % Si, and 1.0 wt % Al, with a remainder constituted by inevitable impurities. A coil component and a test magnetic body related to Example 4 were prepared by the same method as for Example 3 using the first powder and the second powder.

<Observation of Structure and Composition of Oxide Film and Oxide Layer>

In the coil component obtained, the structure and the composition of the oxide films or the oxide layers formed in the surfaces of the soft magnetic alloy particles in the magnetic body were observed by the same method as for Example 1. It was confirmed that the oxide films and the oxide layers having the same structure and composition as in Example 1 were formed.

<Evaluation of Coil Component and Test Magnetic Body>

The characteristics of the coil component and the test magnetic body obtained were measured by the same method as for Example 1. The coil component had a relative permeability of 34, the evaluation sample had a resistivity of 380 Ω·cm and a breakdown voltage of 5.0 kV/cm, and the magnetic body had a breaking stress of 17 kgf/mm$^2$, which was evaluated by the three-point bending test.

Example 5

Preparation of Coil Component and Test Magnetic Body

A coil component and a test magnetic body related to Example 5 were prepared by the same method as for Example 3, except that, instead of the binder resin, a silicon resin was mixed into the slurry for preparing the green sheets.

<Observation of Structure and Composition of Oxide Film and Oxide Layer>

In the coil component obtained, the structure and the composition of the oxide films or the oxide layers formed in the surfaces of the soft magnetic alloy particles in the magnetic body were observed by the same method as for Example 1. It was confirmed that the oxide films and the oxide layers having the same structure and composition as in Example 1 were formed, and in addition, amorphous members containing Si were formed among the oxide films and the oxide layers.

<Evaluation of Coil Component and Test Magnetic Body>

The characteristics of the coil component and the test magnetic body obtained were measured by the same method as for Example 1. The coil component had a relative permeability of 34, the evaluation sample had a resistivity of 600 Ω·cm and a breakdown voltage of 10.0 kV/cm, and the magnetic body had a breaking stress of 18 kgf/mm$^2$, which was evaluated by the three-point bending test.

Comparative Example 1

Preparation of Coil Component and Test Magnetic Body

A coil component and a test magnetic body related to Comparative Example 1 were prepared by the same method as for Example 3, except that the second powder was not used and only the first powder was used as the soft magnetic alloy powder.

<Observation of Structure and Composition of Oxide Film and Oxide Layer>

In the coil component obtained, the structure and the composition of the oxide films or the oxide layers formed in the surfaces of the soft magnetic alloy particles in the magnetic body were observed by the same method as for Example 1. No crystalline oxide was found in the surfaces of the soft magnetic alloy particles or on the contact portions between the particles.

<Evaluation of Coil Component and Test Magnetic Body>

The characteristics of the coil component and the test magnetic body obtained were measured by the same method as for Example 1. The coil component had a relative permeability of 28, the evaluation sample had a resistivity of 10 Ω·cm and a breakdown voltage of 0.92 kV/cm, and the magnetic body had a breaking stress of 7 kgf/mm$^2$, which was evaluated by the three-point bending test.

Comparative Example 2

Preparation of Coil Component and Test Magnetic Body

A coil component and a test magnetic body related to Comparative Example 2 were prepared by the same method as for Example 3, except that the first powder was not used and only the second powder was used as the soft magnetic alloy powder.

<Observation of Structure and Composition of Oxide Film and Oxide Layer>

In the coil component obtained, the structure and the composition of the oxide films or the oxide layers formed in the surfaces of the soft magnetic alloy particles in the magnetic body were observed by the same method as for Example 1. No amorphous oxide film was found in the surfaces of the soft magnetic alloy particles.

<Evaluation of Coil Component and Test Magnetic Body>

The characteristics of the coil component and the test magnetic body obtained were measured by the same method as for Example 1. The coil component had a relative permeability of 22, the evaluation sample had a resistivity of 20 Ω·cm and a breakdown voltage of 1.0 kV/cm, and the magnetic body had a breaking stress of 9 kgf/mm$^2$, which was evaluated by the three-point bending test.

The foregoing results are collectively shown in Table 1.

TABLE 1

|  | μ (at 10 MHz) | Resistivity [Ω · cm] | Breakdown Voltage [kV/cm] | Three-point Bending Test (kgf/mm$^2$) |
|---|---|---|---|---|
| Example 1 | 32 | 500 | 6.2 | 17 |
| Example 2 | 30 | 510 | 5.6 | 16 |
| Example 3 | 34 | 470 | 5.2 | 17 |
| Example 4 | 34 | 380 | 5.0 | 17 |
| Example 5 | 34 | 600 | 10.0 | 18 |
| Comparative Example 1 | 28 | 10 | 0.92 | 7 |
| Comparative Example 2 | 22 | 20 | 1.0 | 9 |

Comparison between Examples and Comparative Examples indicate that the coil components having the magnetic body including the first particles and the second particles as the soft magnetic alloy particles each bonded with others via oxide films or oxide layers having a particular structure have a higher mechanical strength than coil components having a magnetic body without such configuration. Also, in the above configuration, the proportion of Fe in the alloy particles of the magnetic body obtained is higher than the proportion of Fe in the composition of the raw material, and this increases the permeability. Thus, the coil components obtained have excellent magnetic characteristics. Further, in the above configuration, both the resistivity and the breakdown voltage are increased. Thus, the coil components obtained also have a high electric insulation.

INDUSTRIAL APPLICABILITY

According to the present invention, a coil component having an improved mechanical strength is provided. The coil component related to the present invention is less prone to break under vibration or impacts, and thus it is suited for applications in automobiles and the like. In a preferred embodiment of the present invention, the coil component provided has improved magnetic characteristics, and thus the component can be downsized. This also makes the present invention beneficial. Further, in a preferred embodiment of the present invention, the coil component provided has an improved electric insulation, and thus it is suited for applications in automobiles and the like where high voltages are applied.

What is claimed is:

1. A magnetic body, comprising:
   first particles of a first alloy containing Fe and Si, the first particles further containing only Cr as an element that is more easily oxidized than Fe, each of the first particles including a first alloy portion and a first oxide film surrounding the first alloy portion, the first oxide film including an oxide of the first alloy, the first oxide film having a first thickness, each of the first particles being bonded to at least adjacent one of the first particles via the first oxide film;
   second particles of a second alloy containing at least one of Al or Mn, each of the second particles including a second alloy portion and a second oxide film surrounding the second alloy portion, a main component of the second oxide film is at least one of Al or Mn, the second oxide film having a second thickness greater than the first thickness, the second particles being bonded to at least adjacent one of the first particles via the second oxide film; and
   bonding portions containing at least one of Al oxide or Mn oxide, the bonding portions bonding the first particles to each other.

2. The magnetic body of claim 1, wherein the second particles further contain Si, and wherein a proportion by mass of (a) a total of Al and Mn to (b) a total of metal elements plus Si in the second particles is larger than a proportion by mass of (c) Cr to (d) a total of metal elements plus Si in the first particles.

3. The magnetic body of claim 1, wherein the second particles further contain Si, and wherein a proportion by mass of (1) Cr to (2) a total of metal elements plus Si in the first particles is larger than a proportion by mass of (3) a total of Al and Mn to (4) a total of metal elements plus Si in the second particles.

4. The magnetic body of claim 1, wherein the first particles include a first oxide film containing Si, and a proportion by mass of Si to a total of metal elements and Si element in the first oxide film is larger than that in the bonding portions.

5. The magnetic body of claim 4, wherein the first oxide film is an amorphous oxide film containing Si and Cr.

6. The magnetic body of claim 1, wherein the second particles include a second oxide film containing Si, and a proportion by mass of Si to a total of metal elements and Si element in the second oxide film is larger than that in the bonding portions.

7. The magnetic body of claim 6, wherein the second oxide film is a crystalline oxide layer containing at least one of Al oxide or Mn oxide.

8. The magnetic body of claim 1, wherein a number of the first particles is larger than that of the second particles.

9. The magnetic body of claim 1, wherein a number of the second particles is larger than that of the first particles.

10. The magnetic body of claim 1, further comprising filling portions containing Si and provided in voids among the first particles, the second particles, and the bonding portions.

11. The magnetic body of claim 1, wherein the second particles have, in a surface thereof, an oxide layer containing at least one of Al oxide or Mn oxide.

12. A coil component comprising:
    the magnetic body of claim 1; and
    a coil conductor provided in the magnetic body.

13. A circuit board having the coil component of claim 12 installed thereon.

* * * * *